United States Patent [19]

Lok et al.

[11] Patent Number: 5,093,557

[45] Date of Patent: Mar. 3, 1992

[54] SUBSTRATE HEATER AND HEATING ELEMENT

[75] Inventors: Charles K. C. Lok, Norwood; August O. Westner, Winchester, both of Mass.

[73] Assignee: Microscience, Inc., Norwell, Mass.

[21] Appl. No.: 352,510

[22] Filed: May 16, 1989

[51] Int. Cl.$^5$ .............................................. F27B 5/14
[52] U.S. Cl. .................................. 219/388; 219/390; 219/411
[58] Field of Search ............... 219/405, 411, 388, 390; 432/253, 258, 259; 118/728, 729, 725; 198/470.1, 692, 693

[56] References Cited

U.S. PATENT DOCUMENTS

| 3,391,270 | 7/1968 | Harris et al. | 219/385 |
|---|---|---|---|
| 4,334,819 | 6/1982 | Hammerslag | 198/470.1 |
| 4,449,037 | 5/1984 | Shibamata et al. | 219/388 |
| 4,470,369 | 9/1984 | Edgerton | 118/723 |
| 4,487,161 | 12/1984 | Hirata et al. | 118/723 |
| 4,493,977 | 1/1985 | Arai | 219/411 |
| 4,579,080 | 4/1986 | Martin et al. | 118/500 |
| 4,634,375 | 1/1987 | Hailey | 219/388 |
| 4,649,261 | 3/1987 | Sheets | 219/411 |
| 4,673,799 | 6/1987 | Mahawili | 219/399 |
| 4,778,559 | 10/1988 | McNeilly | 156/612 |

OTHER PUBLICATIONS

Goldmann, L. S., "Auxiliary Heater for Belt Furnace", IBM Tech. Disc. Bull., vol. 25, No. 5, Oct. 1982, pp. 2299-2300.
Furnace Products brochure, "Kanthal AF", no date listed.
"Haynes International" brochure, Haynes Alloy No. 214, no date listed.
Thermionics, "Sample Handling in Vacuum", no date listed.

Primary Examiner—Teresa J. Walberg

[57] ABSTRACT

Heat is provided to substrates at a step of a process by providing identical movable heating devices, one for each substrate, placing each substrate onto one of the heating devices, sequentially moving each device into a position where the step of the process can be performed on the substrate, and causing each of the devices to provide heat to the substrate at each step of the process.

23 Claims, 9 Drawing Sheets

SUBSTRATE HEATER AND HEATING ELEMENT

BACKGROUND OF THE INVENTION

This invention relates to a substrate heater and a heating element.

A substrate may undergo a series of processing steps, one or more of which may include heating, in the course of forming a processed substrate. Typically, the substrate is moved from station to station within a deposition chamber where the successive processing steps are performed. The conditions which exist at each station may vary greatly from, e.g., atmospheric pressure to high vacuum, room temperature to high temperature, and air environment to a pure gas environment.

SUMMARY OF THE INVENTION

In general, in one aspect, the invention features a method for providing heat to substrates at a step of a process by providing separate movable heating devices, one for each substrate, placing each substrate onto one of the heating devices, sequentially moving each device into a position where the step of the process can be performed on the substrate, and causing each device to provide heat to the substrate at the step of the process.

In preferred embodiments, the method may include moving the devices sequentially into another position; a step of the process may be performed in a vacuum environment or at atmospheric pressure; preferably, the vacuum is held at any chosen level below atmospheric pressure down to $10^{-11}$ Torr, or in an oxygen environment, preferably held at a chosen partial pressure within the range of $10^{-3}$ to 760 Torr, into which the devices can be moved. Movement of each heating device may be accomplished by insertion of a support into a portion of the device or by engaging a support on an external wall of the device, and then transferring the device to another position where another step of the process can be performed. The method may include causing each of the devices to heat the substrate to a temperature of at least 1000° C. and which does not vary by more than ±50° C. uniformly across the substrate.

In another aspect, the invention features resistive heating a substrate using an apparatus that includes a heating alloy which has an oxidation resistant outer surface and is stable at a temperature of at least 1000° C. in a vacuum.

In preferred embodiments, the alloy is stable in a vacuum environment up to $10^{-11}$ Torr. Preferably, the alloy contains iron, chromium, and aluminum and is, most preferably, Kanthal-AF; or it contains nickel, chromium, iron, aluminum, and barium, and is, most preferably, Haynes alloy; either alloy may be in wire or sheet form. Most preferably the outer layer is aluminum oxide. The apparatus may further include a nonconductive material, such as a ceramic, most preferably, alumina or boron nitride, and the wire alloy is wrapped around the nonconductive material.

In another aspect, the invention features resistive heating a substrate using a movable apparatus that includes both holes for receiving a fork support and sides which a second alternative support may embrace; the holes and sides enable movement of the apparatus from a first position to a second position In another aspect, the apparatus includes pins capable of resting within holes of a support, and the holes for receiving a fork support and the pins enable movement of the apparatus from a first position to a second position.

Preferred embodiments include the following features. The fork holes have electrically conductive walls, and either the pins or the sides are also electrically conductive. Nonconductive means separate the alloy from the substrate and the wire alloy. The wire alloy has a first end and a second end and is wrapped around the nonconductive material that serves to electrically separate the alloy from the substrate. A first conductive screw holds the first end of the wire alloy and a second conductive screw holds the second end of the wire alloy. An external power source is electrically coupled to the apparatus and the first screw is in electrical contact with either the fork holes, the sides, or the pins of the apparatus and is thus able to conduct current supplied by the external power source to the first screw and through the wire to the second screw.

In another aspect, the invention features a method of forming an oxidation resistant heating element from an alloy, in which the alloy is attached to a nonconducting heat resistant material to form an assembly, the assembly is placed in an oxygen environment, the oxygen environment is subjected to a chosen temperature within the range of 800° C. to 1000° C. for a period of time, and the assembled alloy is then slowly cooled.

Preferred embodiments include the following features. The alloy is wound around the nonconducting material, and the assembly alloy is subjected to 1000° C. for a chosen time within the range of 10 min. to 1 hour; preferably for a time of 30 minutes. Alternatively, the heating element may be assembled as part of a movable apparatus for resistive heating a substrate and the entire apparatus is placed in the oxygen environment, subjected to the chosen temperature, and cooled.

In another aspect, the invention features an oxidation-resistant heating element made of an iron, chromium and aluminum alloy and having an aluminum oxide outer surface. Preferably, the heating element also contains nickel and barium.

Because the movable heating device is oxidation-resistant in a vacuum environment, the invention allows fabrication and surface analysis steps to be performed on a series of substrates, e.g., forming high temperature superconducting circuits on substrates, by attaching the substrates to the movable heaters and moving the assemblies through all of the chosen processing steps requiring a variety of processing environments. The heater can be cleaned, reused, and discarded as appropriate and are relatively inexpensive to fabricate. Dedicated heaters need not be provided at the processing station. Furthermore, during movement of the substrate/heating device, electrical contact between the heating device and the supports may be maintained using an electrically conductive portion of the device, e.g, holes, pins or sides, that corresponds to an electrically conductive portion of the support. Therefore, electrically produced heat may be supplied to the substrate at any chosen time during processing.

Other features and advantages of the invention will be apparent from the description of the preferred embodiments, and from the claims.

DESCRIPTION OF PREFERRED EMBODIMENTS

We first briefly describe the drawings.

MOVEMENT OF HEATER DURING PROCESSING

Figure 1:
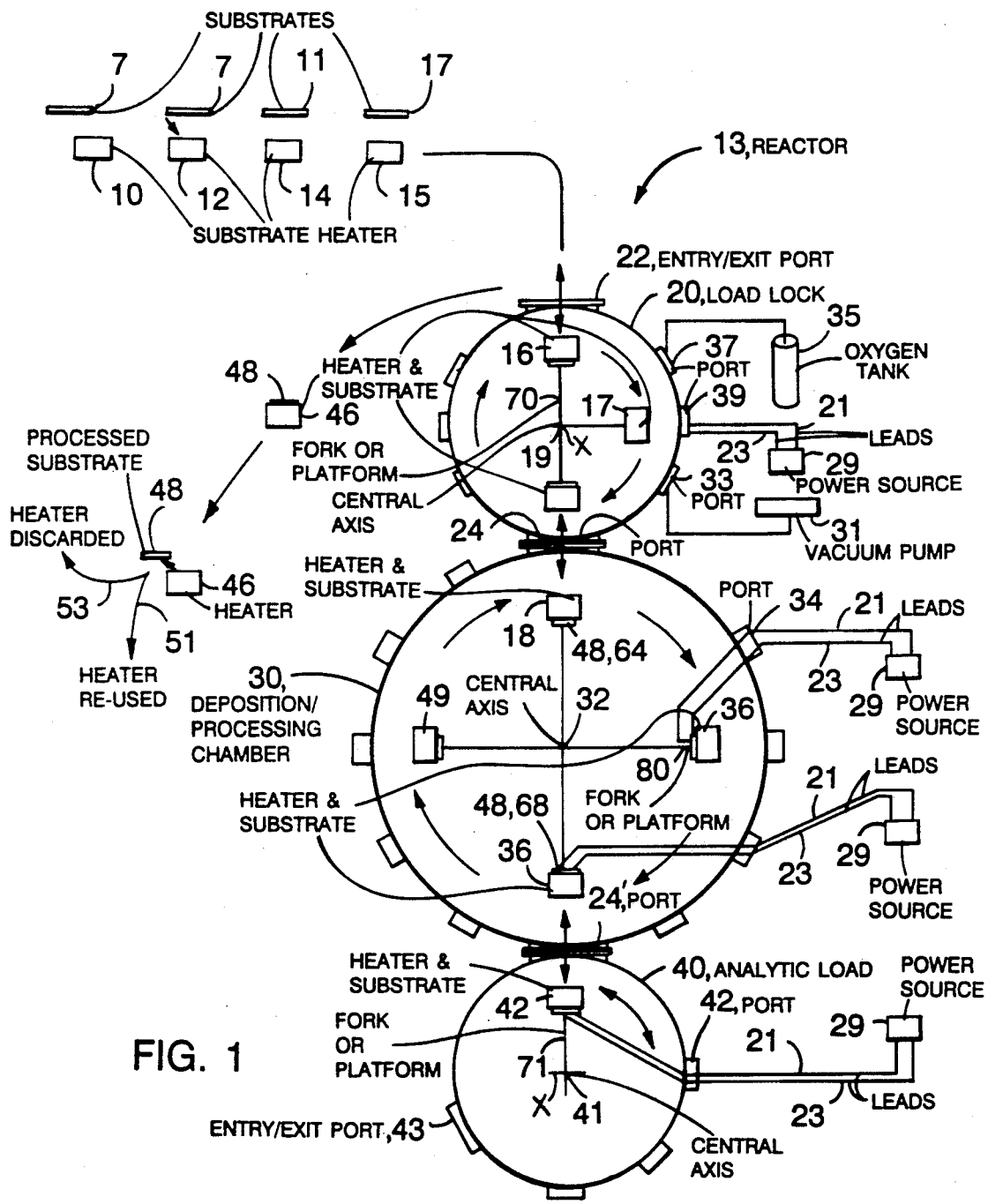
FIG. 1 is a schematic view of a substrate-treatment process using a reactor.

Referring to FIG. 1, a series of identical substrates 7, 9, 11, 17 are each attached to a separate movable substrate heater 10, 12, 14, 15 at the first step of a process that includes steps to be performed within a reactor 13. Each heater and its substrate are transferred between and within different environments for processing. Each heater performs two functions: it holds the substrate and it supplies heat to the substrate in selected processing steps. Reactor 13 has a load lock 20, a central processing or deposition chamber 30, and an analytical lock 40, each of which has a central axis 19, 32, 41, respectively, around which the heater may be positioned during processing. Radiating out from each central axis are electrically conductive forks or platforms, e.g., 70, 80, 71, for supporting the movable heaters and for supplying electricity to the heaters. Movement of the forks or platforms may occur 360° around a X-axis (which is perpendicular to the surface of the page) and also around the X-axes. The processing chamber 30 may contain more than one central axis.

Each lock or chamber has windows, or ports, e.g., load lock ports 37, 39, 33, through which, for example, oxygen can be introduced from oxygen tank 35, electricity can be conducted using leads 21, 23 connected to a power source 29, or air can be removed from the lock or chamber to reduce the internal pressure using a vacuum pump 31. The processing chamber 30 and analytic lock 40 also have one or more ports, e.g., 34 and 42, respectively, which may be used for any one of these purposes. Between the locks and the processing chamber are ports 24 and 24' for movement of the substrate/heater between either lock and the chamber. In addition, the locks are loaded or unloaded through entry/exit ports 22, 43.

For processing a substrate in sequential steps of the process, each substrate/heater is moved into the load lock 20 through entry/exit port 22 to a position 16. The load lock is maintained at atmospheric pressure during loading and may be evacuated using vacuum pump 31 after the port 22 is closed. A pure gas, e.g., oxygen, may then be bled into the load lock through port 37 from oxygen tank 35. The substrate heater may then be moved to position 17, where a step of the process may be performed using heat. When heat is required at a step of the process, power source 29 is turned on and current is conducted through leads 21, 23 which connect the power supply to the heater 17 in a manner to be described.

The substrate/heater may then be transferred into the processing chamber 30 through port 24 to position 18, then to positions 36 and 38, each position corresponds to a step of the process at which heat may be supplied from power source 29 using leads 21, 23. During transfer of the substrate/heater between chambers, the processing chamber 30 is maintained under vacuum, e.g., $10^{-11}$ Torr, by bringing the lock to an equivalent vacuum before transfer. Conditions within the processing chamber, e.g., the vacuum or gas content within the chamber, or the temperature of the heater, may be altered to conform to the desired processing step using ports, e.g., 34, as described above for the load lock.

If analysis of the substrate is desired, the processed substrate may be transferred into the analytic chamber 40 through port 41; analysis may occur at position 43 or other positions (not shown) within the analytic chamber and, if heat or a vacuum or gas environment is required during analysis of the processed substrate, then a change in the environment may be effected using an analytic chamber port 42, as described above for ports leading into either the load lock or processing chambers. After analysis, the processed substrate may be removed directly from the analytic reactor 13 after transfer back through the processing chamber along positions 38, 49, 18, through port 24, into the load lock 20, and out of the load lock through port 22. After processing in the reactor, the processed substrate 48 can be lifted off the heater 46 (arrow 45), and the heater may be discarded (arrow 51) or cleaned (arrow 53) for re use.

Each heater is designed to resist sublimation and oxidation in a high temperature/high vacuum environment of the kind that may be required for substrates such as high temperature superconducting materials (HTSC), e.g. the Y Ba—Cu O Bi Sr Ca—Cu O and Ti—Ba Ca—Cu 0 HTSC groups. These materials are metal oxides with low resistance at room temperature, and may be fabricated from precursors which are subjected to processing in a deposition chamber, e.g., at 1000° C. at $10^{-6}$ Torr.

In one example, the dimensions of the heater and the mounted substrate are limited by the size of reactor chamber ports 22, 24, 41, 43; for example, for a 100 mm diameter port, the heater may hold a substrate wafer of size between 25.4 mm by 50.8 mm. Although the maximum length of the heater can be 25.4 mm and the maximum width of the heater can be 95.0 mm in order to fit through a 100 mm port, it is preferred that only 70% of this size be used. This safety margin will allow the heater to be transferred between load lock, deposition, and analytic chambers 20, 30, 40 through ports 24 and 41, should there be misalignment between them. The heater may have a thickness of approximately 30 mm.

THE HEATER

Among the alternative ways for the heater to perform both functions of heating and moving the substrate are through conductive forks that contact conductive holes in the heater; conductive "E pieces", which are sleeves that grip conductive sides of the heater; or conductive pin-hole pieces that fit around conductive pins of the heater.

Referring to FIGS. 2a, 2b, 5a, and 5b, in either the grabber embodiment or the pin embodiment, the heater 10, 11 includes a nonconductive central ceramic portion 52 around which a conductive alloy wire 79 is wrapped, and two nonconductive ceramic plates 50, 54 which sit on the bottom and top, respectively, of the central ceramic portion 52. The ceramic is 99% aluminum oxide, $Al_2O_3$.

Figure 2A:
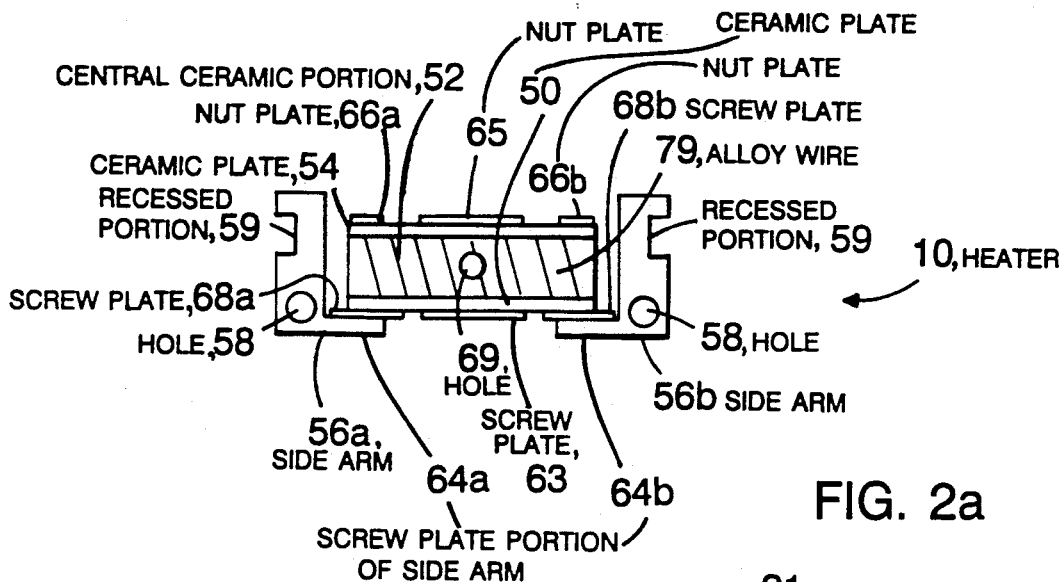
FIGS. 2a, 2b are front views of a movable heater alone and with associated grabbers, respectively.
Figure 2B:
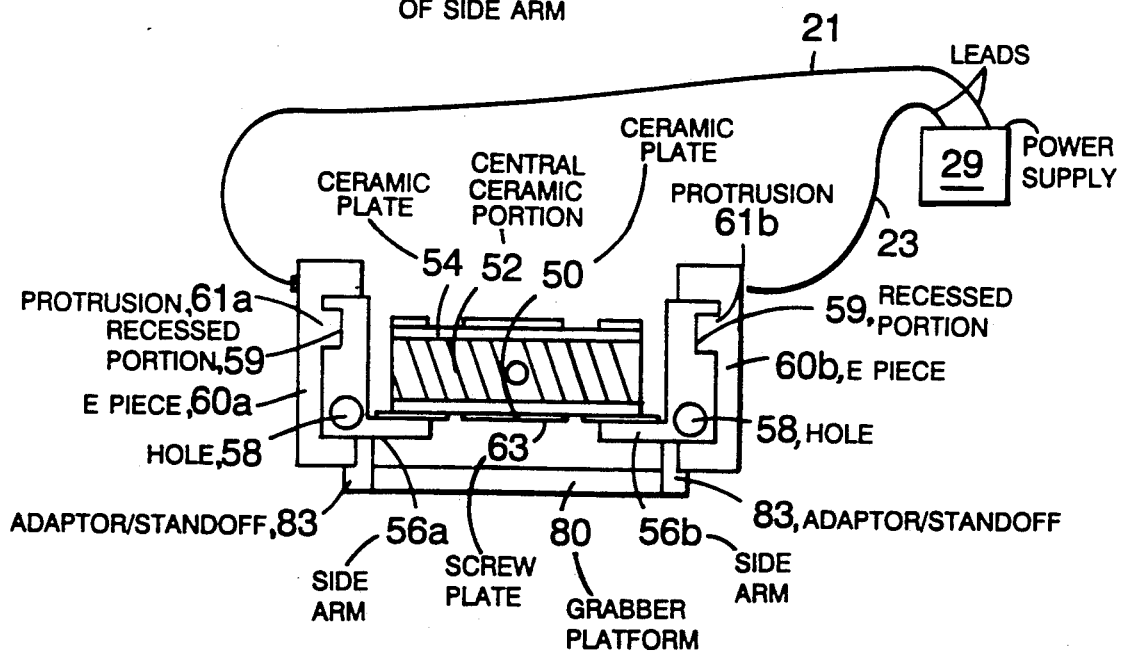
Figure 3:
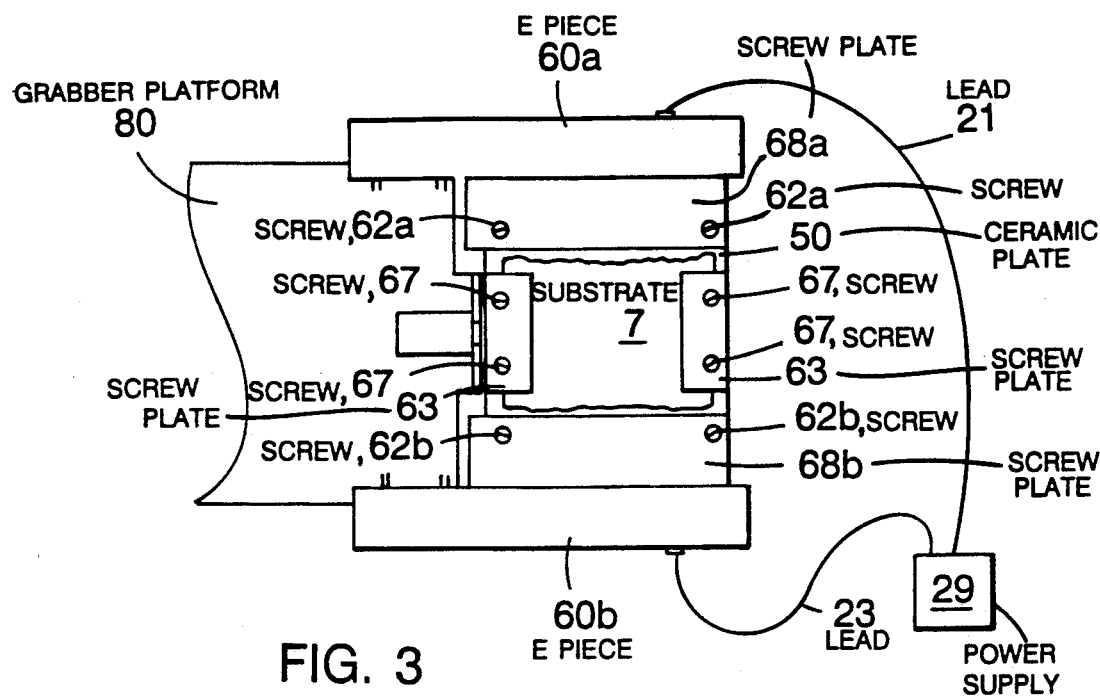
FIG. 3 is a bottom view of the movable heater of FIG. 2b.

Referring to FIGS. 2a, 2b and 3, in the grabber embodiment, adjoining each side of the central ceramic portion, including 50, 52, 54 of heater 10, are side arms 55a, 56b made of conductive stainless steel 304. Each arm 55a, 56b contains a hole 58 into which a prong 90a, 90b of a fork 70 (FIG. 8) can be inserted, and a recessed portion 59 to receive, respectively, protrusion 61a, 61b of an "E" piece 60a, 60b. E pieces 60a, 60b are permanently attached to a grabber platform 80 (FIG. 3); they are not permanently attached to heater 10, but grab onto it (FIG. 2b) during the grabber movement discussed below with respect to FIG. 9. Arms 55a, 56b are joined to central ceramic portion 50, 52, 54 using screws 62a, 62b; each screw extends from each arm at the screw plate portions 64a, 64b of the arms 55a, 56b through screw plates 68a and 68b, and through ceramic portions 50, 52, 54, to nut plates 65a, 66b. The screws are made of stainless steel 304 and are thus able to conduct current from arms 55a, 56b to the conductive alloy 79 that is wrapped around ceramic portion 52. The screw plates 68a, 68b are made of ceramic so as to prevent heat loss from the heating element through arms 55a, 56b. The nut plates are made of alloys. In addition to screw plates 68a, 68b and nut plates 65a, 66b, there are centrally positioned screw plates 63 and nut plates 65 that hold the substrate in place, depending on whether it is affixed to the top or bottom of the heater. (The orientations "top" and "bottom" are relative to the figures and do not have functional significance.) The substrate 7 may be fixed to the middle of ceramic plate 50 or, alternatively, to ceramic plate 54 of heater 10 using screws 67; these screws extend through screw plates 63 and ceramic portions 50, 52, 54 to nut plates 65. The substrate itself is not screwed to the ceramic, but is held down at either end by screw plates 63 (FIG. 3). A hole 69 through the middle of ceramic portion 52 is for insertion of a thermometer to measure temperature within the ceramic portion 52.

E pieces 60am, 60b are also made of stainless steel 304 and make good contact with their respective arms 55a, 56b (FIG. 2b). The leads 21, 23 are attached respectively to the E pieces 60a, 60b.

In operation, the substrate and heater become hot when power source 29 is turned on and current is conducted, e.g., by lead 21 to conductive "E" piece 60a and then conductive heater side 56a which touches conductive screw 62a which pass through side 56a (FIG. 3). Screw 62a is in electrical contact with one end of wire heat resistant alloy 79 that is wrapped around ceramic portion 52. Thus, the current may be conducted from the screw 62a through the wire 79 to its other end, which is in electrical contact with screw 62b (FIG. 3), and then through the corresponding parts of the heater to lead 23 and power source 29. Electrical current passing through the alloy wire 79 causes it to become hot and heat is conducted through ceramic plates 50, 54 to the substrate 7 (FIG. 3).

Each E piece 60a, 60b is attached indirectly to the body of the grabber platform 80 through a ceramic adaptor or standoff 83 so that the E piece is fully insulated from grabber platform 80.

Figure 4:
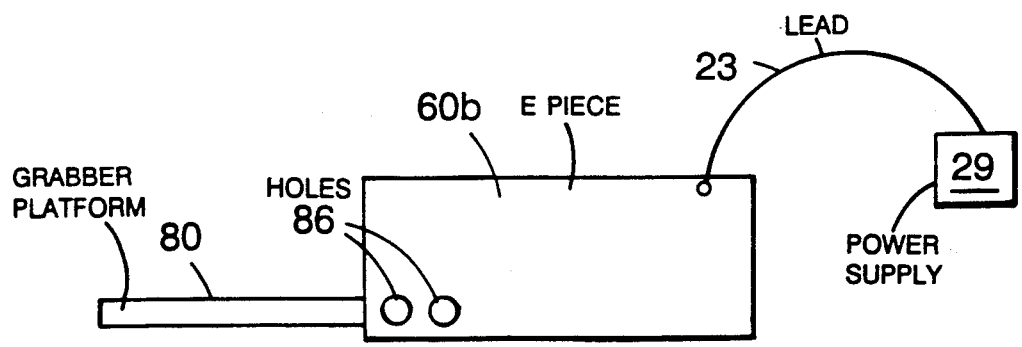
FIG. 4 is a side view of the movable heater.

Referring to FIG. 4, holes 86 on E piece 60b receive screws for attachment of the ceramic standoff (83 in FIG. 2b); the standoff joins E piece 60a or 60b to the grabber platform 80. Because E piece 60b is electrically insulated from grabber platform 80 due to ceramic standoff 83, current will not pass to the grabber platform.

Referring to FIGS. 5a, 5b, 6, 7 in the pin embodiment, heater 11 contains (stainless steel 304) pins 72a, 72b, which extend down from arms 55a, 56b and fit snugly into pin holes (not shown) of conductive pin hole sleeves 76. Pin hole sleeves 76, made of stainless steel 304, are permanently attached to pin platform 82, but are not permanently attached to heater 11. Each pinhole sleeve 76 is fully insulated from pin-hole platform 82 through a ceramic standoff 83. As in the grabber approach, the heater 11 becomes hot when current passes from power source 29 along lead 21 to pin hole sleeve 76 and to conductive pin 72, due to the contact between these two conductive pieces, and then to the wire alloy 79, and the circuit is completed through the corresponding pin and pin-hole sleeve.

ASSEMBLY OF THE FORK

Figure 5A:
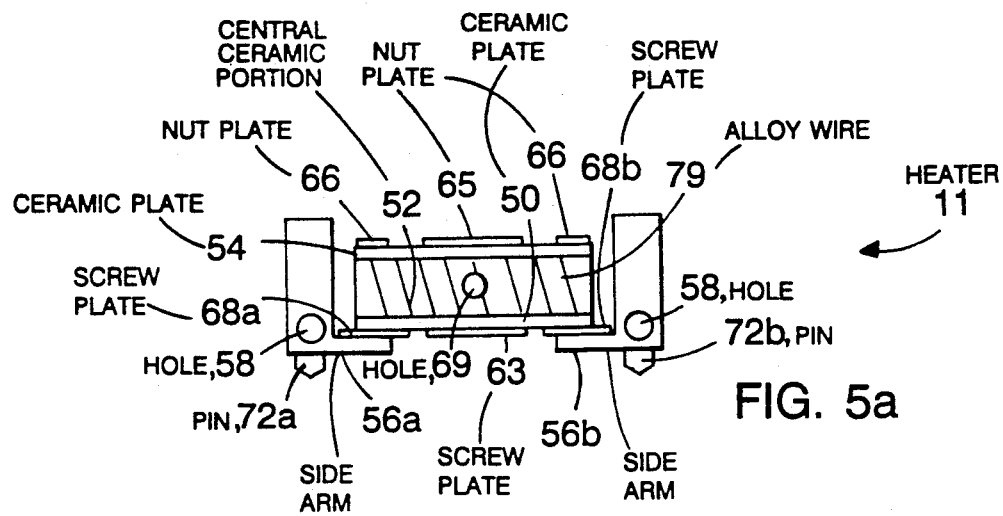
FIGS. 5a, 5b are front views of a movable heater alone and with associated pin hole sleeves.
Figure 5B:
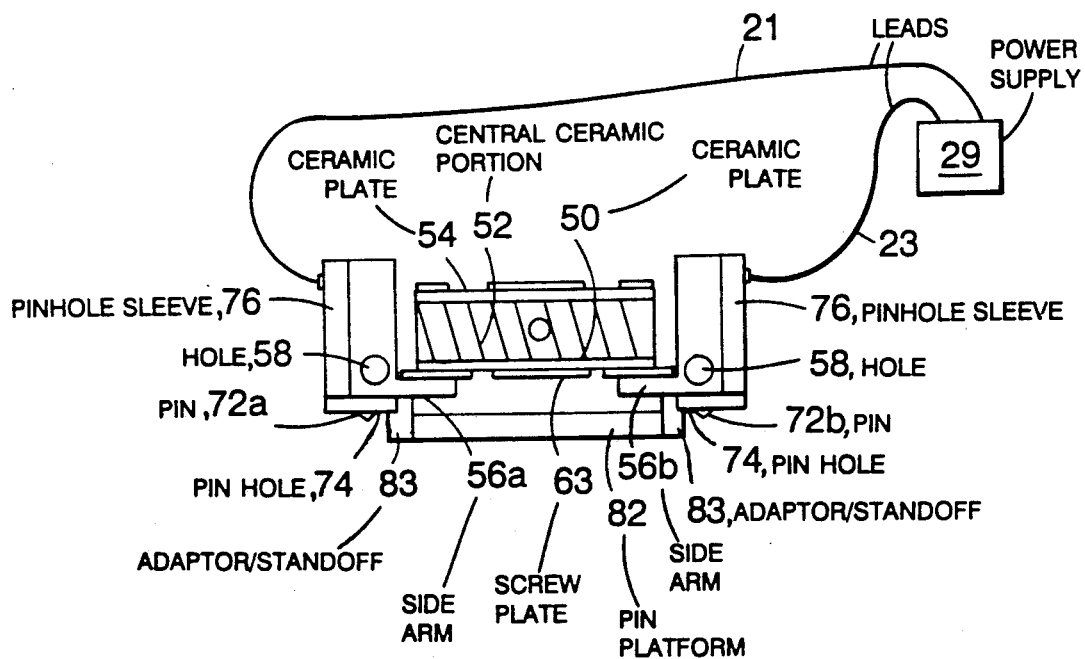
Figure 6:
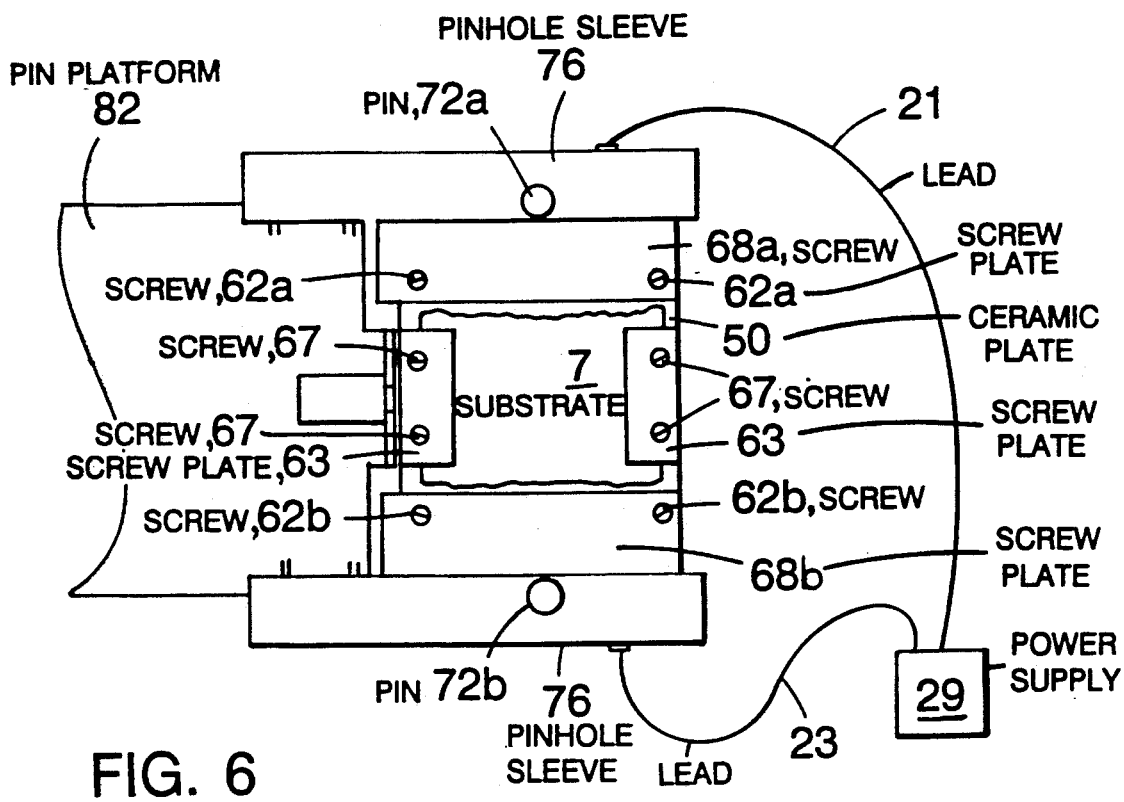
FIG. 6 is a bottom view of the movable heater of FIG. 5b.
Figure 7:
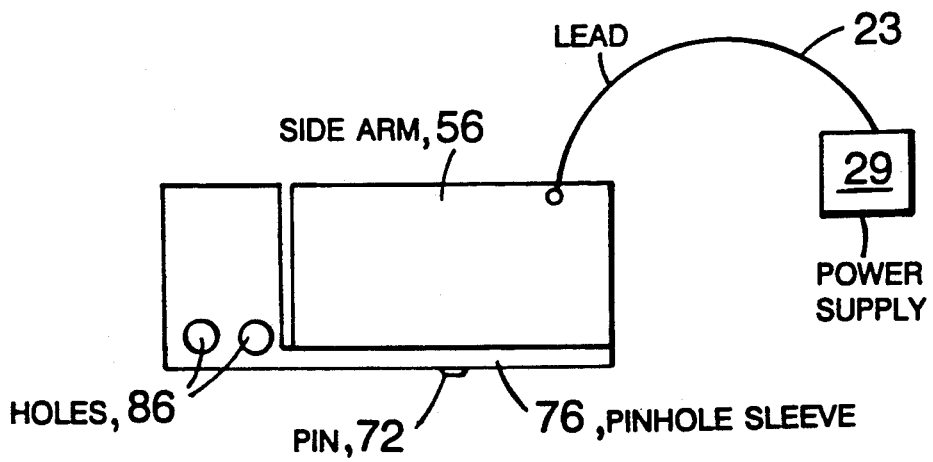
FIG. 7 is a side view of the movable heater.
Figure 8A:
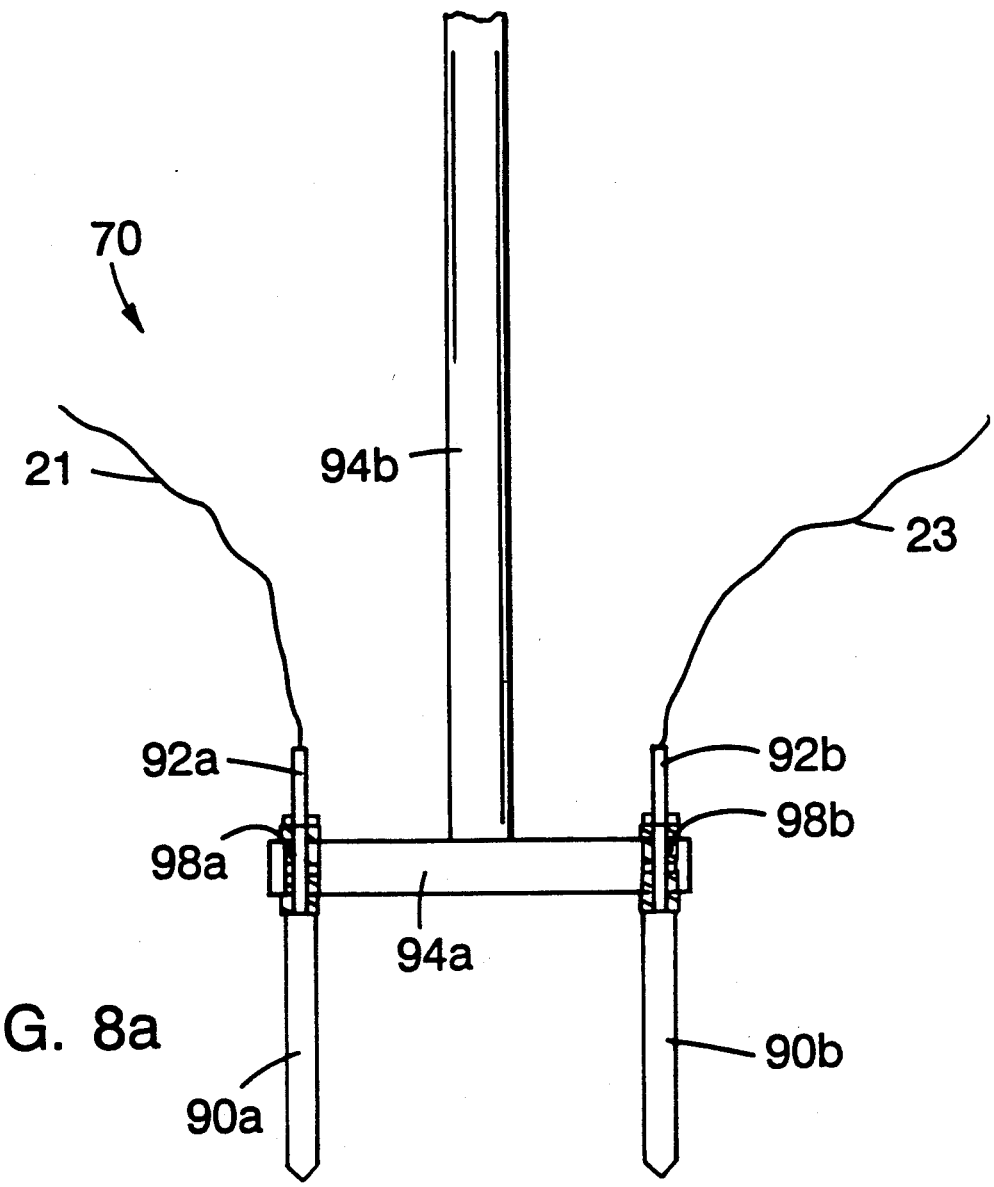
FIGS. 8a, 8b are a top view of a conductive fork partially in section, and a front view of the fork, respectively.
Figure 8B:
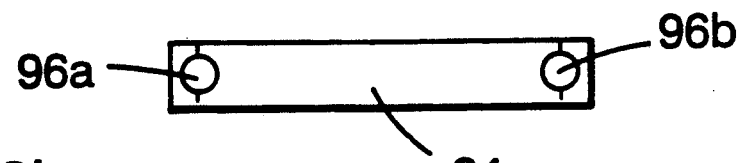

Referring to FIG. 8a, fork prongs 90a, 90b of fork 70 slide into holes 58 of heater 10 or 11 and thus provide mechanical support to enable movement of the heater and also provide an electrically conductive path between the conductive leads and the heater. The current travels through fork prongs 90a, 90b, which are made of stainless steel 304, from conductive leads 21, 23 via the ends 92a, 92b of the fork prongs, also made of stainless steel 304; the fork ends 92 may be threaded for the purpose of attaching the leads using nuts. Fork prongs 90, shown in partial section in the figure, are mounted perpendicular to and on opposite ends of a stainless steel 304 center piece 94a. Fork ends 92a, 92b are mounted to center piece 94a through center piece holes 95a, 96b, but the fork prongs do not directly contact center piece 94a due to ceramic standoffs 98a, 98b. The standoffs 98a, 98b serve to electrically isolate the conductive fork prongs from the center piece. Center pieces 94a and fork arm 94b move as one piece during operation of the fork. If desired, a thermocouple (not shown) may be attached to center piece 94a by spot-welding the thermocouple to the middle of the center piece between the fork prongs; the thermocouple senses the temperature within the heater cartridge by sliding into hole 69 of the heater (FIGS. 2a and 5a).

Figure 9:
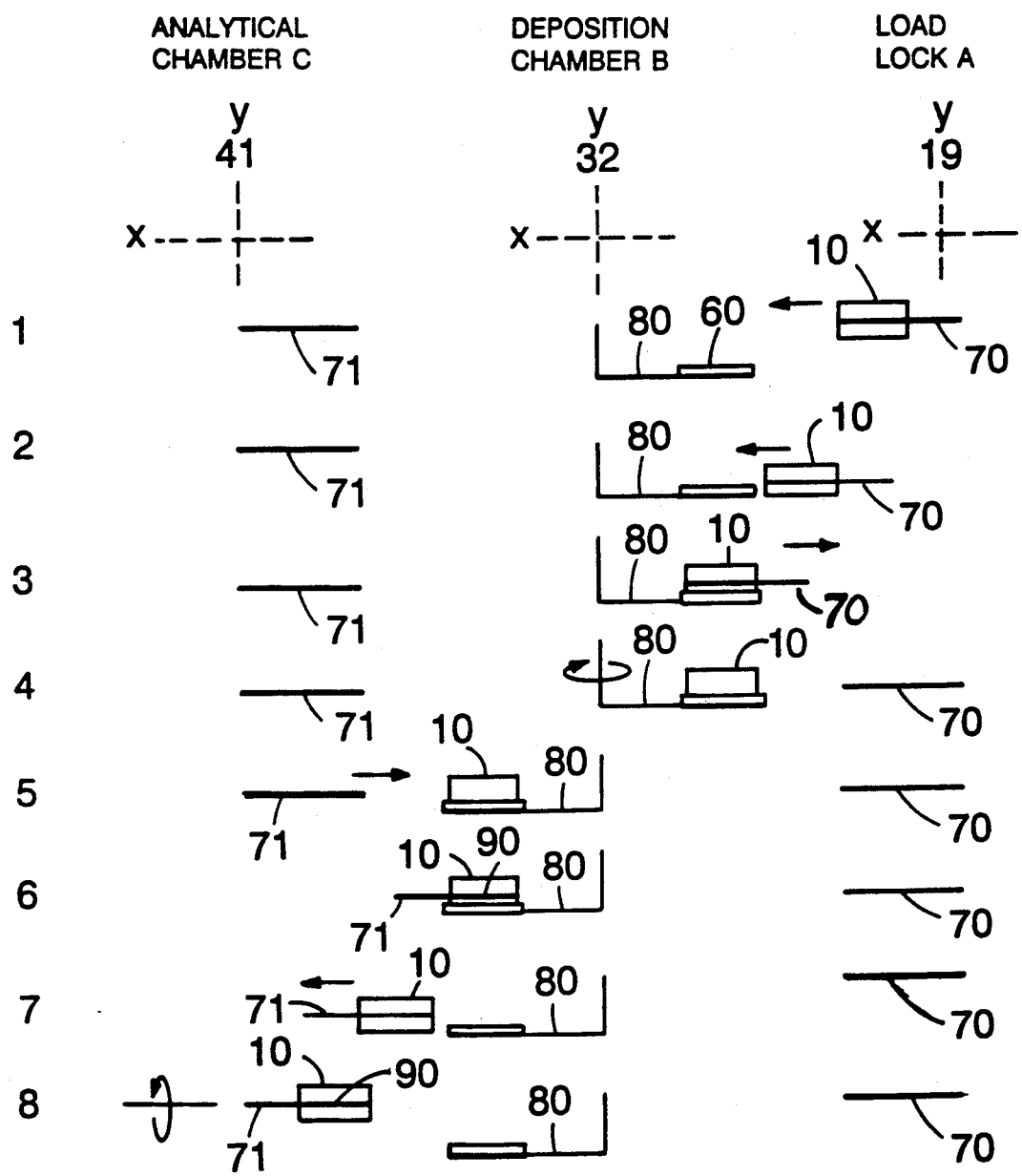
FIG. 9 is a schematic diagram of movement of the heater using the grabber approach.
Figure 10:
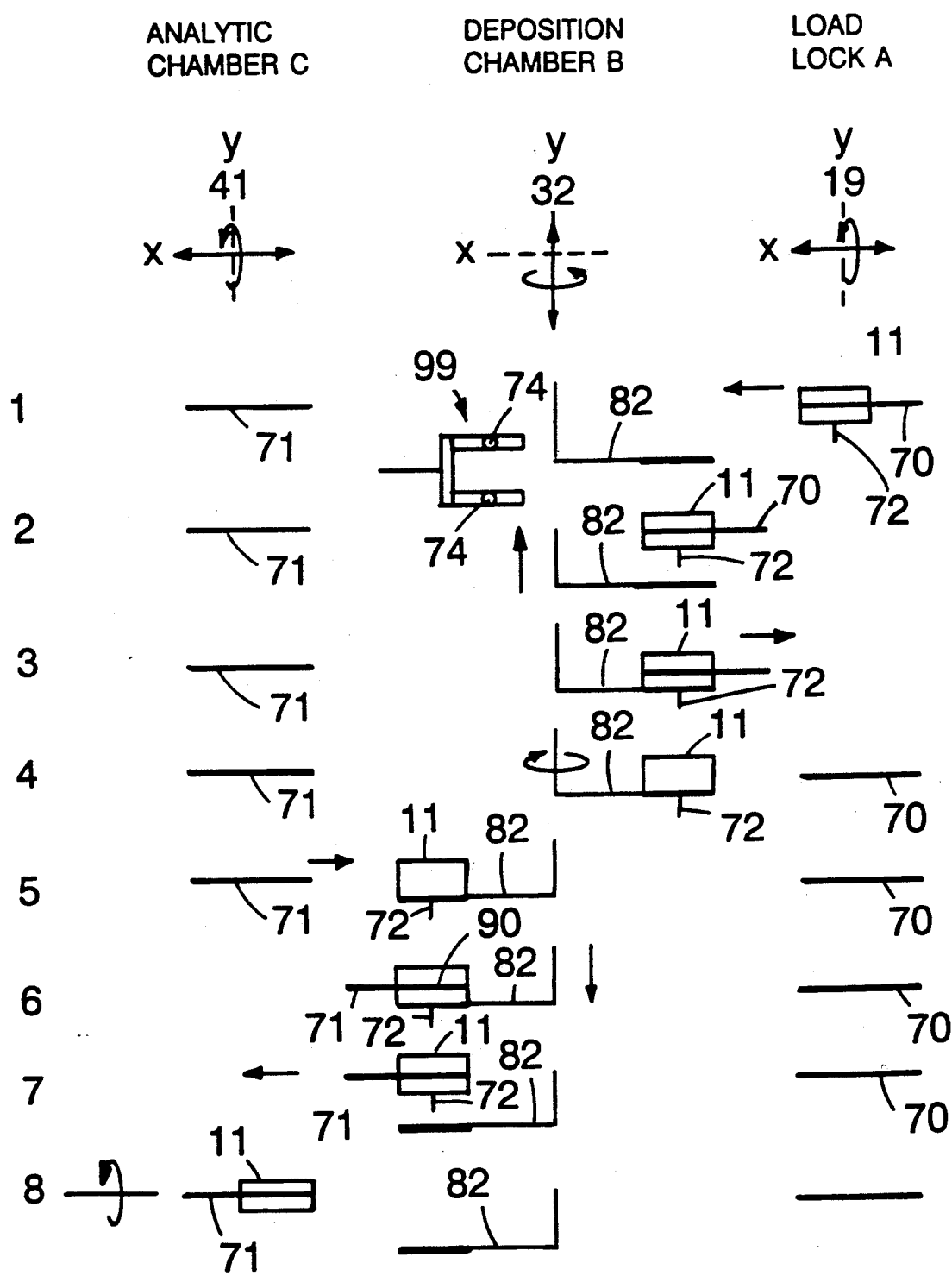
FIG. 10 is a schematic diagram of movement of the heater using the pin approach.

Referring to FIGS. 9 and 10, positions A, B, and C respectively represent load lock chamber 20 with central Y axis 19, processing chamber 30 with central Y axis 32, and analytical chamber 40 with central Y axis 41, respectively.

In line 1 of FIG. 9, fork 70 holds heater 10 and is moving from position A in the load lock chamber to position B in the processing chamber; movement of the fork and heater is both along the X-axis direction and around the Y axis until the heater sides are aligned in the same plane as the E pieces (60a, 60b in Figs. 2b–4) of the grabber platform 80; in line 2, fork 70 moves along the X axis towards grabber platform 80 until the heater sides are inserted within the E pieces of the grabber platform 80 (this configuration is shown from the front in FIG. 2b; note that in FIG. 9 the E pieces are shown only schematically by reference number 60); in line 3, fork 70 then moves away from grabber platform 80 along the X axis; in line 4, the grabber platform containing the heater turns, e.g., 180°, around the X-axis through the deposition chamber, thereby delivering heater 10 to a second fork 71, identical to fork 70; in line 5, fork 71 moves along the X-axis toward the heater, and fork prongs 90 insert into the heater in line 6. In line 7, fork 71 moves along the X axis away from the grabber, thus withdrawing the heater from the grabber platform 80, and, in line 8, fork 71 continues movement of the heater away from the grabber platform along the X axis and into position C, the analytical chamber, where it can be rotated about the X-axis.

Referring to FIG. 10, in the pin approach, in line 1, fork 70 holds heater 11 and moves along the X axis until it is aligned with pin-hole platform 82 (the pin hole platform is also shown from above, 99, with pin holes 74); in line 2, pin hole platform 82 then moves upward along the Y axis until pin holes 74 receive heater pins 72a, 72b (line 3); in line 4, fork 70 then slides out of heater 11; in lines 4 and 5, pin hole platform 82 containing heater 11 turns 180° around the Y axis to deliver the heater to fork 71; in line 6, fork 71 then moves along the X-axis until fork prongs 90 insert into heater 11; in line 7, pin hole platform 82 then moves downward along the Y axis, thus disengaging the pin holes 74 from the heater pins 72; and in line 8, fork 71 moves away from the pin platform along the X-axis.

For both the grabber and pin embodiments, if desired, forks 70, 71 may rotate 180° around the X-axis, as shown in line 8, thus turning the heater upside-down relative to its initial upright position. This rotational movement may be desired if deposition occurs from both the top and bottom of processing chamber 30. In addition, as mentioned above in describing FIG. 1, more than one central axis may be present in the processing chamber, thus allowing for transfer of the heater about each axis and between the axes to cover a larger spatial area. Note that, for each step of either grabber or pin embodiments, the heater is always in electrical contact with either the grabber arms or the pin-hole sleeves and the fork. Therefore, heat may be supplied to a substrate in any of the positions described during movement or while the heater is being held stationary.

ASSEMBLY OF MOVABLE HEATER

Figure 11:
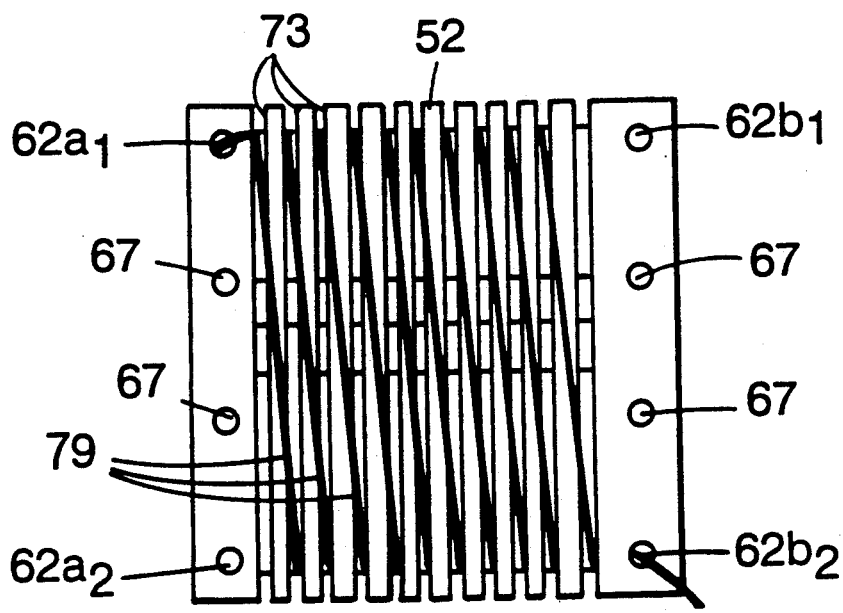
FIG. 11 is a schematic top view of the wire alloy wrapped around a ceramic piece.

The heater is made of a heating alloy, an insulating material, and stainless steel 304, all of which are stable at high temperature, for example, 1000° C., in ultra high vacuum, for example, $10^{-11}$ Torr, are inert to oxidation and metallic ion corrosion, and have high emissivities. Referring to FIG. 11, the heater is constructed by wrapping a wire alloy 79 around and into grooves 73 etched into the surface and edges of the ceramic insulating material 52. When electric current is applied to one end of the wrapped wire at d wire pattern to $62a_1$, it will pass along the wrapped the other end of the wire at $62b_2$, thus generating heat which is absorbed by the emissive insulating material and transferred to the ceramic plates 50, 54 and the substrate 7.

The alloy must be oxidation resistant upon heating; for example, Kanthal AF or Haynes alloys may be used. Kanthal AF (Kanthal, Hallstahammar, Sweden) is a FeCrAl alloy for element temperatures up to 1400° C. Haynes Alloy No. 214 (Haynes International, Inc., Kokomo, ID) is a nickel based alloy containing Cr, Fe, Al, and Y. Kanthal AF and Haynes alloys are available in a variety of forms, for example, wire, strip, bar, or ready made forms. By itself, neither alloy is stable, i.e., resistant to sublimation in vacuum during heating. However, if treated by a process of this invention that causes the aluminum to leach to the surface of the alloy, the aluminum will form a densely packed and inert aluminum (III) oxide when it contacts oxygen. This hard oxide coating prevents further oxidation and corrosion of the alloy, prevents further leaching of aluminum to the surface, and, during heating in vacuum, prevents sublimation of metals from the alloy.

The insulating material is a nonconducting emissive material, such as ceramic, and is used as a base for the conductive alloy. Aluminum oxide ($Al_2O_3$) and boron nitride are preferred ceramics because they can withstand oxidation, corrosion, and high temperature thermal treatment. In addition, their emissivities are very high, approximately 0.9; thus, heat absorbed from the heating element is radiated to the substrate as infra red heat. 99.9% pure alumina should be used for ultra high-vacuum and high temperature environments, because it has minimal outgassing during high thermal treatment; extra pure boron nitride is also preferred because it delivers uniform heat distribution from heater to substrate.

The treatment process for preparing the heating alloy consists of first assembling the alloy on a nonconducting heat-resistant material, such as a ceramic plate which has circular cross section grooves etched on its surface, by winding the wire around the ceramic plate. Then the wire-wound ceramic plate (referred to herein as the heating element) is placed in a pure oxygen environment and subjected to a temperature of 800° C. to 1000° C. for a period of time, which may be 30 min. Then the heating element is cooled slowly. Alternatively, the heating element may be assembled into the movable heater before subjecting the alloy to heat. The thus treated alloy is well-suited for heating in pure oxygen and/or ultra-high vacuum environments.

WINDING PATTERN OF ALLOY

The heater provides very high temperature and uniform thermal contact with the substrate. As used herein, "high temperature" means approximately 1000° C., or in the general range of 800° C. to 1200° C. "Uniform" thermal contact means the temperature across ceramic plates 50, 54 does not vary by more than ±50° C. In order to achieve high temperature and uniform thermal contact, the alloy must conduct enough current and be patterned around the space limitation of ceramic piece 52 so as to generate the required temperature, e.g., 1000° C., uniformly across the substrate. As shown in FIG. 11, the wire alloy 71, which in this example has a diameter 0.032-0.035 inches, must be wound a predetermined number of times around grooves 73 etched into ceramic portion 52 and must not cross over itself in winding. The following example describes factors that relate to determining how many times the wire alloy must be wound around the ceramic piece to deliver a high, uniform temperature to the substrate when electric current is passed through it.

Factors that affect the design of the heating element of the heater are: the surface area of the heater, the resistance of the heating element, the size of the wire, the surface load of the wire, and the radiant heat loss at 1000° C. In table I, formulae for calculating the surface area of the heating element are shown; in table II, the following relationships for Haynes alloy are given: temperature in ° C., power dissipation (W)/cm², total power dissipation (W), resistance (R) in ohms, current (I) in Amps, and surface power load (S.L.)/cm².

TABLE I

| | |
|---|---|
| Resistance per unit length (R) where L = length in cm P = resistivity A = cross-sectional area; | R/L = P/A |
| Power dissipation from a resistive load: where W = power per unit area, I = resistance R = current in Amp. | W = I² × R, |
| Surface power load (W$_s$): W/A$_s$, where A$_s$ = surface area of the heating element. | W$_s$ = |

TABLE II

| | Haynes alloy | | | | |
|---|---|---|---|---|---|
| °C. | W/cm₂ | total W | R | I | S.L./cm² |
| 0 | 0.03 | 0.57 | 1.949 | 0.54 | 0.02 |
| 100 | 0.11 | 1.98 | 1.949 | 0.54 | 0.02 |
| 500 | 2.02 | 36.44 | 1.949 | 4.32 | 1.30 |
| 800 | 7.52 | 135.29 | 1.949 | 8.33 | 4.84 |
| 1000 | 14.89 | 268.02 | 1.949 | 11.73 | 9.60 |

A 0-30 Amp power source may be used to generate current and a voltage regulator controls the exact voltage and current outputs. A voltage regulator may be used that both removes radio frequency interference (K-type) and withstands high voltage. The voltage is fixed at 110 VAC; therefore, the minimum resistance value is 3.67 ohms, the maximum current is 30 Amps, and the maximum power is 3300 Watt. Since the emissivities of both oxidized heating alloy and ceramic is approximately 0.9, the energy loss in radiation is approximately 241 Watts. At 1000° C., the power density is 14.89 Watt cm² and the total output power of the heater required to compensate the energy loss in radiation is 268.1 Watts. For example, if the diameter of the wire is 1 mm and the overall length of the wire is 0.8 m, then the current required to bring the heater temperature to 1000° C. is 13.7 Amps.

For a heater that must fit through a 100 mm port, the heat zone has a maximum size of 30 mm². If the minimum insulating space between the wires is 1 mm, then the maximum number of turns the wire can make around the ceramic portion will be 30/(1+1)=15; similarly, if the insulating space is 2 mm, then the maximum number of turns of the wire is 10. Variations of this design may be calculated using the formulae given in Table I and example calculations presented in Table II.

OTHER EMBODIMENTS

Figure 12:
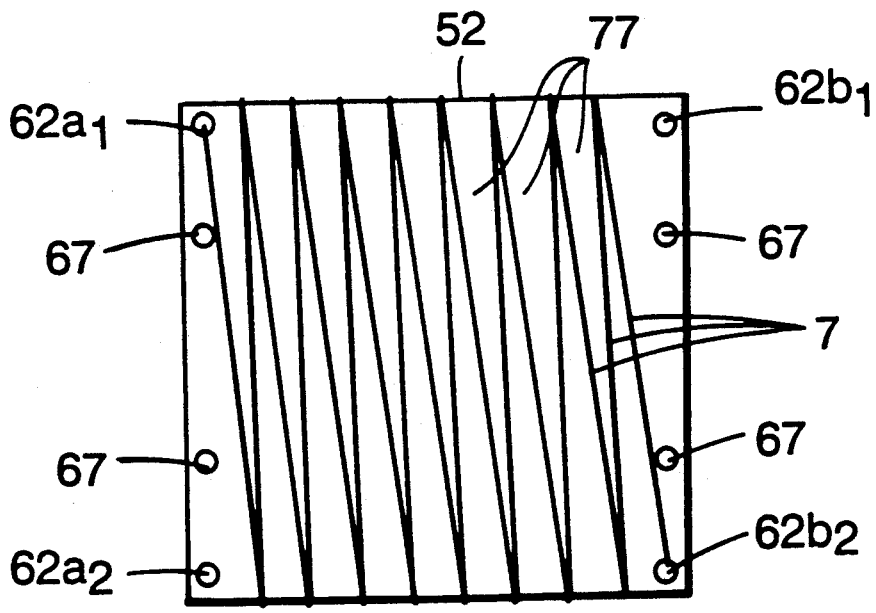
FIG. 12 is a schematic top view of an etched sheet form of alloy.

Other embodiments are within the following claims; for example, the pattern that the current follows during conduction through the alloy may be designed differently; for example, square or circular spirals may be used, or any other pattern that avoids localized heating and cooling and cross over of the alloy on itself. Alternatively, instead of alloy wire, a pure alloy plate (e.g., 1 mm thick), as shown in FIG. 12, may be etched in a design which carries the current from an electronegative source applied to screw $62a_1$ at one end of the plate along the raised alloy pattern 75 defined by the etched space 77 to an electropositive source applied to screw $62d_2$ at the opposite end of the plate. The formula given for the wound-wire embodiment described above may also be used to determine how to etch the alloy plate to allow current to be conducted to produce in a high temperature and uniform heating.

Any ceramic may be used as insulating material in the heater, as long as it has the following properties; it is nonconductive, resistant to sublimation or cracking at high temperatures, for example, 1000° C., in ultra-high vacuum, for example, $10^{-11}$ Torr, and is highly emissive. Other environments in which both the ceramic insulating material and the alloy will be stable are, e.g., pure gas environments such as argon, nitrogen, and silane; corrosive gas environments, such as sulfer dioxide, should be avoided.

The movable heater of the invention may also be used solely for heating the substrate or solely for carrying the substrate. For example, a substrate less heater may be used to supply radiant heat to a substrate that is carried by another heater. In addition, the heater may be used to carry more than one sample.

The movable heater may also be used to promote nucleation of any kind of thin film substrate, e.g., substrates having other electrical or mechanical properties; e.g., for the deposition of dielectric or metal coatings.

We claim:

1. A method for providing uniform heat to substrates at a step of a process, said method comprising
   providing separate movable heating devices, one for each substrate;
   placing each said substrate onto one of said devices;
   sequentially moving each said device into a position where said step of said process can be performed on said substrate; and
   causing each of said devices alone to provide heat to said substrate at said step of said process.

2. The method of claim 1, wherein said step of moving each said device comprises inserting a support into a portion of said device and causing said support to transfer said device to another position where another step of said process can be performed.

3. The method of claim 1, wherein said step of moving said device comprises engaging a support on an external wall of said device and causing said support to transfer said device to another position where another step of said process can be performed.

4. The method of claim 1, further comprising moving said devices sequentially into another said position.

5. The method of claim 1, wherein said process step is performed in a vacuum environment.

6. The method of claim 5 wherein said vacuum environment is held at any chosen level below atmospheric pressure down to $10^{-11}$ Torr.

7. The method of claim 6 wherein said heating results in a temperature on said substrate of at least 1000° C.

8. The method of claim 7 wherein said temperature varies by no more or less than 50° C. across said substrate.

9. The method of claim 1 wherein said step is performed in an oxygen environment.

10. The method of claim 9, said oxygen environment being held at a chosen partial pressure within the range of $10^{-3}$ to 760 Torr.

11. A movable apparatus for resistive heating a substrate, said apparatus comprising
    a pair of holes, each hole being positioned to receive a separate prong of a fork support, and
    sides configured to receive a second alterative support, said holes and said sides being configured to enable movement of said apparatus from a first position to a second position.

12. A movable apparatus for resistive heating a substrate, said apparatus comprising
   a pair of holes, each hole being positioned to receive a separate prong of a fork support, and
   pins downwardly directed for resting within holes of a second support,
   said holes and said pins being configured to enable movement of said apparatus from a first position to a second position.

13. The apparatus of claim 11 or 12, said apparatus being electrically conductive.

14. The apparatus of claim 13 wherein said fork holes have electrically conductive walls.

15. The apparatus of claim 14 wherein said pins are electrically conductive.

16. The apparatus of claim 15 wherein said sides are electrically conductive.

17. The apparatus of claim 14, further comprising a conductive oxidation resistant wire heating alloy.

18. A movable apparatus for resistive heating a substrate, said apparatus comprising
   holes for receiving a fork support, wherein said holes comprise electrically conductive walls,
   electrically conductive sides configured to receive a second alternative support,
   said holes and said sides being configured to enable movement of said apparatus from a first position to a second position,
   a conductive oxidation-resistant wire heating alloy,
   nonconductive means separating said alloy from said substrate, wherein said wire alloy, having a first and a second end, is wrapper around said nonconductive means.

19. The apparatus of claims 18, further comprising
   a first conductive screw for holding said first end of said wrapped alloy, and
   a second conductive screw for holding said second end of said wire alloy.

20. The apparatus of claim 19 wherein an external power source is electrically coupled to said apparatus and said first screw is in electrical contact with said fork holes, wherein said fork holes are able to conduct current supplied by said power source to said first screw through said wrapped wire to said second screw.

21. The apparatus of claim 19 wherein an external power source is electrically coupled to said apparatus and said first screw is in electrical contact with said sides, wherein said sides are able to conduct current supplied by said power source to said first screw through said wrapped wire to said second screw.

22. The apparatus of claim 18 wherein an external power source is electrically coupled to said apparatus and said first screw is in electrical contact with said pins, wherein said pins are able to conduct current supplied by said power source to said first screw through said wrapped wire to said second screw.

23. A movable apparatus for resistive heating a substrate, said apparatus comprising
   holes for receiving a fork support, wherein said holes comprise electrically conductive walls,
   electrically conductive pins downwardly directed for resting within holes of a second support,
   said holes and said pins being configured to enable movement of said apparatus from a first position to a second position,
   a conductive oxidation-resistant wire heating alloy, and
   nonconductive means separating said alloy from said substrate, wherein said wire alloy, having a first and a second end, is wrapped around said nonconductive means.

* * * * *